(12) United States Patent
Hwang (10) Patent No.: US 7,883,920 B2
(45) Date of Patent: Feb. 8, 2011

(54) IMAGE SENSOR AND METHOD FOR MANUFACTURING AN IMAGE SENSOR

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 210 days.

(21) Appl. No.: 12/204,831

(22) Filed: Sep. 5, 2008

(65) Prior Publication Data

US 2009/0065822 A1     Mar. 12, 2009

(30) Foreign Application Priority Data

Sep. 6, 2007   (KR) ...................... 10-2007-0090293
Sep. 7, 2007   (KR) ...................... 10-2007-0091083
Jul. 7, 2008   (KR) ...................... 10-2008-0065719

(51) Int. Cl.
    *H01L 21/00*     (2006.01)
(52) U.S. Cl. ....................................................... 438/57
(58) Field of Classification Search ........................ None
    See application file for complete search history.

(56) References Cited

U.S. PATENT DOCUMENTS

2002/0100915 A1*   8/2002   Hynecek ...................... 257/158
2006/0011952 A1*   1/2006   Ohkawa ...................... 257/291
2007/0018266 A1    1/2007   Dupont et al.
2010/0013907 A1    1/2010   Lee

FOREIGN PATENT DOCUMENTS

KR   10-2005-0117674 A   12/2005
KR   10-2007-0019452 A    2/2007

* cited by examiner

*Primary Examiner*—Walter L Lindsay, Jr.
*Assistant Examiner*—Andre' C Stevenson
(74) *Attorney, Agent, or Firm*—Saliwanchik, Lloyd & Saliwanchik (57) ABSTRACT

Provided are methods for manufacturing an image sensor. A method for manufacturing an image sensor can include: forming a readout circuitry on a substrate; forming an electrical junction region in the substrate; forming an interconnection connected to the electrical junction region; and forming an image sensing device on the interconnection. The readout circuitry can be formed on a first substrate. The electrical junction region can be formed in the first substrate to electrically connect the image sensing device with the readout circuitry. The image sensing device can be formed using a second substrate that is then bonded on the interconnection.

20 Claims, 8 Drawing Sheets

IMAGE SENSOR AND METHOD FOR MANUFACTURING AN IMAGE SENSOR

CROSS-REFERENCE TO RELATED APPLICATIONS

The present application claims the benefit under 35 U.S.C. §119 of Korean Patent Application Nos. KR 10-2007-0090293, filed Sep. 6, 2007, KR 10-2007-0091083, filed Sep. 7, 2007, and KR 10-2008-0065719, filed Jul. 7, 2008, which are hereby incorporated by reference in their entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

In a related art, a photodiode is formed with readout circuitry in a substrate using ion implantation. As the size of a photodiode reduces more and more for the purpose of increasing the number of pixels without an increase in a chip size, the area of a light receiving portion reduces, so that image quality reduces.

Also, since a stack height does not reduce as much as the reduction in the area of the light receiving portion, the number of photons incident to the light receiving portion also reduces due to diffraction of light, called airy disk.

As an alternative to overcome this limitation, an attempt of forming a photodiode using amorphous silicon (Si), and forming a readout circuitry on a silicon (Si) substrate and forming a photodiode on the readout circuitry using a method such as water-to-water bonding has been made (referred to as a "three-dimensional (3D) image sensor). The photodiode is connected with the readout circuitry through an interconnection.

Meanwhile, according to a related art, since both the source and the drain at the sides of the transfer transistor of the readout circuitry are heavily doped with N-type impurities, a charge sharing phenomenon occurs. When the charge sharing phenomenon occurs, the sensitivity of an output image is reduced and an image error may be generated.

Also, in the related art, a photo charge does not readily move between the photodiode and the readout circuitry. Thus, a dark current is generated or saturation and sensitivity reduce.

BRIEF SUMMARY

Embodiments of the present invention provide an image sensor that can inhibit the occurrence of charge sharing while increasing a fill factor, and a manufacturing method thereof.

Embodiments also provide an image sensor that can minimize a dark current source and inhibit reduction in saturation and sensitivity by providing a swift movement path for a photo charge between a photodiode and a readout circuitry, and a manufacturing method thereof.

In one embodiment, a method for manufacturing an image sensor comprises: forming a readout circuitry on a first substrate; forming an electrical junction region in the first substrate to electrically connect with the readout circuitry; forming an interconnection on the electrical junction region; and forming an image sensing device on the interconnection.

In another embodiment, a method for manufacturing an image sensor comprises: forming a readout circuitry comprising a first transistor and a second transistor on a first substrate; forming an electrical junction region between the first transistor and the second transistor in the first substrate, the electrical junction region being electrically connected with the readout circuitry; forming an interconnection electrically connected to the electrical junction region through the second transistor; and forming an image sensing device on the interconnection.

The details of one or more embodiments are set forth in the accompanying drawings and the description below. Other features will be apparent from the description and drawings, and from the claims.

DETAILED DESCRIPTION

Hereinafter, embodiments of an image sensor and a manufacturing method thereof are described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

The present disclosure is not limited to a complementary metal oxide semiconductor (CMOS) image sensor, but can be readily applied to any image sensor requiring a photodiode.

Figure 1:
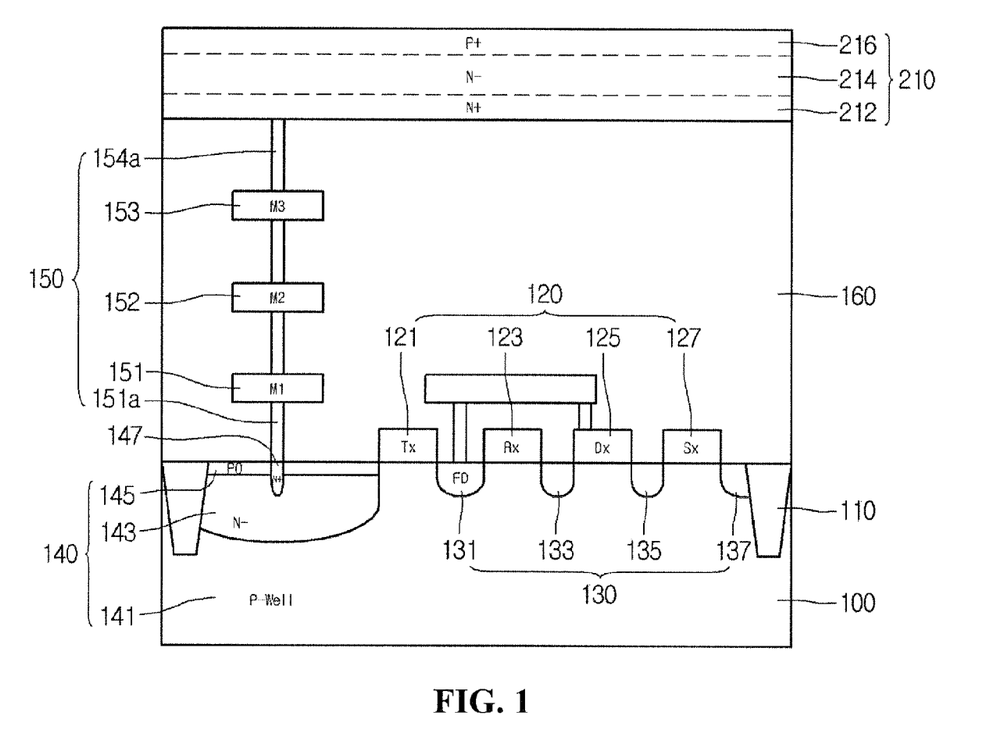
FIG. 1 is a cross-sectional view of an image sensor according to an embodiment.

FIG. 1 is a cross-sectional view of an image sensor according to an embodiment.

In one embodiment, an image sensor can include a readout circuitry 120 formed on a first substrate 100; an electrical junction region 140 in the first substrate, the electrical junction region 140 being electrically connected with the readout circuitry 120; an interconnection 150 on the electrical junction region 140; and an image sensing device 210 on the interconnection 150.

The image sensing device 210 can be, but is not limited to, a photodiode. For example, in certain embodiments, the image sensing device 210 can be a photogate or a combination of a photodiode and a photogate. Meanwhile, though the photodiode 210 is described as being formed in a crystalline semiconductor layer, the photodiode is not limited thereto. For example, the photodiode 210 can be formed in an amorphous semiconductor layer.

Reference numerals not explained in FIG. 1 are described in the following manufacturing method.

Hereinafter, a method for manufacturing an image sensor according to an embodiment is described with reference to FIGS. 2 to 7.

Figure 2:
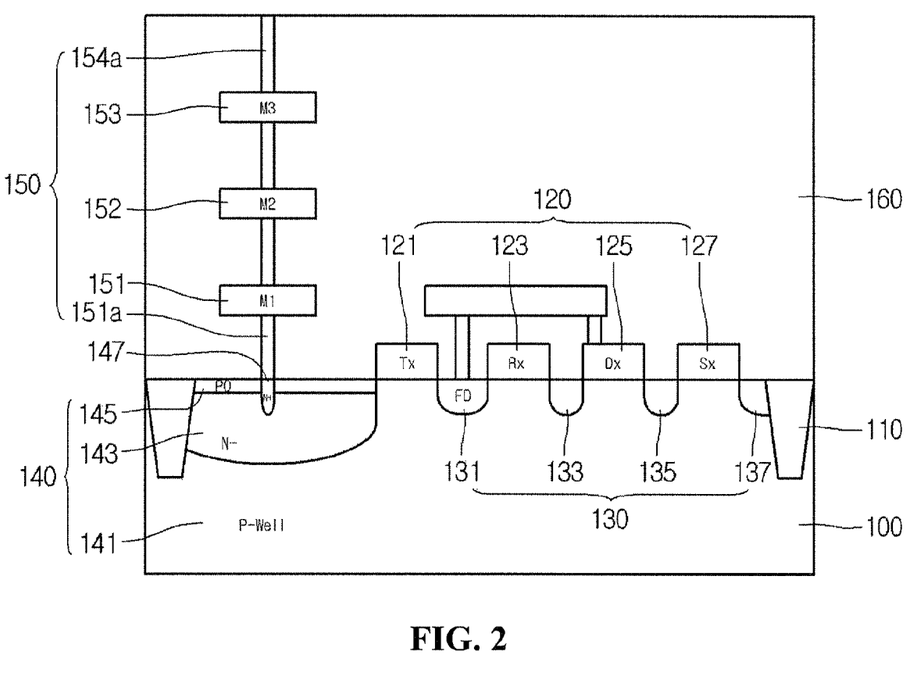
FIGS. 2 to 7 are cross-sectional views of a method for manufacturing an image sensor according to an embodiment.

The first substrate 100 in which the interconnection 150 and the readout circuitry 120 are formed can be prepared. For example, a device isolation layer 110 can be formed in the second conduction type first substrate 100, so that an active region is defined. The readout circuitry 120 including a transistor can be formed in the active region. In one embodiment, the readout circuitry 120 can include a transfer transistor Tx 121, a reset transistor Rx 123, a drive transistor Dx 125, and a select transistor Sx 127. After forming the gates for the transistors, a floating diffusion region FD 131 and ion implantation regions 130 including source/drain regions 133, 135, and 137 of respective transistors can be formed. Also, according to an embodiment, a noise removal circuit (not shown) can be added to improve sensitivity.

The forming of the readout circuitry 120 in the first substrate 100 can include forming the electrical junction region 140 in the first substrate 100 and forming a first conduction type connection region 147 connected with the interconnection 150 on the electrical junction region 140.

The electrical junction region 140 can be, but is not limited to, a PN junction. For example, the electrical junction region 140 can include a first conduction type ion implantation layer 143 formed on a second conduction type well 141 (or a second conduction type epitaxial layer), and a second conduction type ion implantation layer 145 formed on the first conduction type ion implantation layer 143. For example, the PN junction can be, but is not limited to, a P0 (145)/N− (143)/P− (141) junction such as shown in FIG. 2. The first substrate 100 can be a second conduction type substrate, but embodiments are not limited thereto.

According to an embodiment, a device is designed such that there is a potential difference between the source and drain of the transfer transistor Tx, so that a photo charge can be fully dumped. Accordingly, a photo charge generated from the photodiode is fully dumped to the floating diffusion region, so that the sensitivity of an output image can be improved.

That is, according to an embodiment, the electrical junction region 140 is formed in the first substrate 100 where the readout circuitry 120 is formed as in FIG. 2 to allow a potential difference to be generated between the source and the drain at the sides of the transfer transistor Tx 121, so that a photo charge can be fully dumped.

Hereinafter, a dumping structure of a photo charge according to an embodiment is described in detail.

Unlike a node of the floating diffusion FD 131, which is an N+ junction, the PNP junction 140, which is an electrical junction region 140 and to which an applied voltage is not fully transferred, is pinched-off at a predetermined voltage. This voltage is called a pinning voltage, which depends on the doping concentrations of P0 region 145 and N− region 143.

Specifically, an electron generated from the photodiode 210 (see FIG. 1) moves to the PNP junction 140, and is transferred to the node of the floating diffusion FD 131 and converted into a voltage when the transfer transistor Tx 121 is turned on.

Since a maximum voltage of the P0/N−/P− junction 140 becomes the pinning voltage, and a maximum voltage value of the node of the floating diffusion FD 131 becomes Vdd minus a threshold voltage Vth of Rx 123, an electron generated from the photodiode 210 in the upper portion of a chip can be fully dumped to the node of the floating diffusion FD 131 without charge sharing by implementing a potential difference between the sides of the transfer transistor Tx 121.

That is, according to an embodiment, the P0/N−/P-well junction is formed in the first substrate 100 to allow a +voltage to be applied to the N− region 143 of the P0/N−/P -well junction and a ground voltage to be applied to the P0 145 and P-well 141 during a 4-Tr active pixel sensor (APS) reset operation, so that a pinch-off is generated at the P0/N−/P-well double junction at a predetermined voltage or more as in a bipolar junction transistor (BJT) structure. This is called a pinning voltage. Therefore, a potential difference is generated between the source and the drain at the sides of the transfer transistor Tx 121, which inhibits a charge sharing phenomenon during the on/off operations of the transfer transistor Tx.

Therefore, unlike a case where a photodiode is simply connected with an N+ junction (N+/P-well) as in a related art, limitations such as saturation reduction and sensitivity reduction can be avoided.

Next, according to one embodiment, a first conduction type connection region 147 can be formed between the photodiode and the readout circuitry to provide a swift movement path of a photo charge, so that a dark current source is minimized, and saturation reduction and sensitivity reduction can be prevented.

For this purpose, a first conduction type connection region 147 for ohmic contact can be formed on the surface of the P0/N−/P− junction 140 according to an embodiment. The N+ region 147 can be formed to pass through the P0 region 145 and contact the N− region 143.

Meanwhile, to inhibit the first conduction type connection region 147 from becoming a leakage source, the width of the first conduction type connection region 147 can be minimized. For this purpose, in one embodiment, a plug implant can be performed after a via hole for a first metal contact 151a is etched. In another embodiment, an ion implantation pattern (not shown) can be formed on the substrate and the first conduction type connection region 147 can then be formed using the ion implantation pattern as an ion implantation mask.

That is, a reason for locally and heavily doping only a contact forming portion with N type impurities in this embodiment is to facilitate ohmic contact formation while minimizing a dark signal. In case of heavily doping the entire transfer transistor source, a dark signal may be increased by a Si surface dangling bond.

An interlayer dielectric 160 can be formed on the first substrate 100, and the interconnection 150 can be formed. The interconnection 150 can include, but is not limited to, the first metal contact 151a, a first metal 151, a second metal 152, a third metal 153, and a fourth metal contact 154a.

Figure 3:
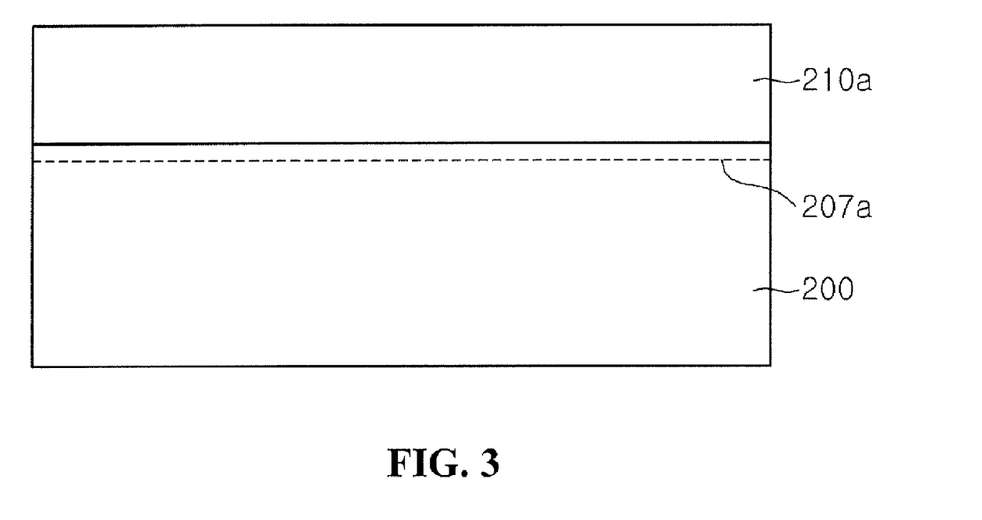

A crystalline semiconductor layer 210a can be formed on a second substrate 200 as in FIG. 3. Although the photodiode 210 is described as being formed in the crystalline semiconductor layer, embodiments are not limited thereto. Accordingly, the image sensing device can adopt a 3-dimensional (3D) image sensor structure located on the readout circuitry to raise a fill factor. In addition, by being formed inside the crystalline semiconductor layer, defects inside the image sensing device can be reduced.

For example, a crystalline semiconductor layer 210a can be formed on a second substrate 200 using epitaxial growth. After that, hydrogen ions can be implanted between the second substrate 200 and the crystalline semiconductor layer 210a to form a hydrogen ion implantation layer 207a. In one embodiment, the implantation of the hydrogen ions can be performed after the ion implantation for forming the photodiode 210.

Figure 4:
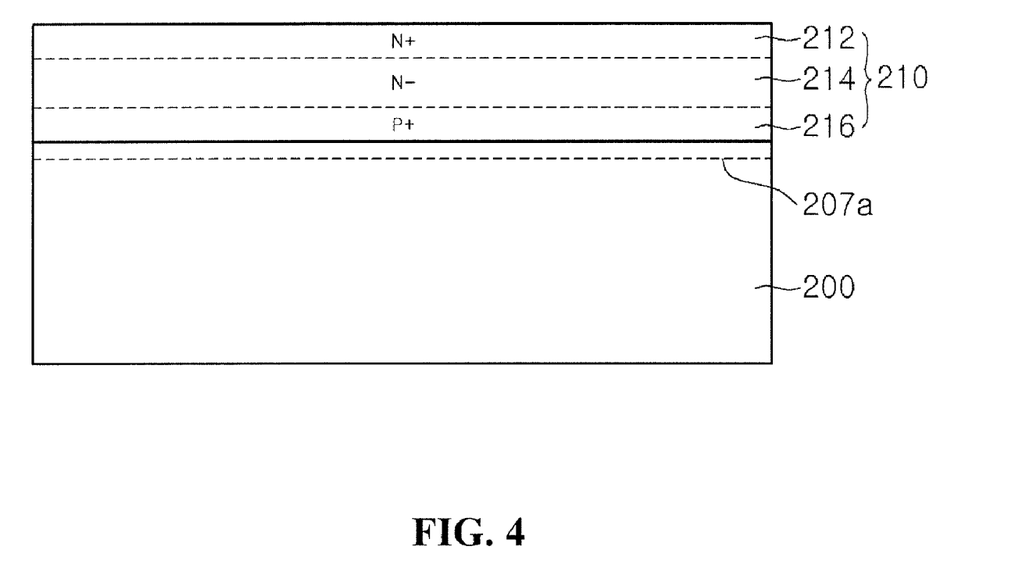

Next, referring to FIG. 4, the photodiode 210 can be formed in the crystalline semiconductor layer 210a using ion implantation. For example, a second conduction type conduction layer 216 can be formed in the lower portion of the crystalline semiconductor layer 210a. For example, a high concentration P-type conduction layer 216 can be formed in the lower portion of the crystalline semiconductor layer 210a by performing blanket-ion implantation on the entire surface of the second substrate 200 without a mask. In an embodiment, the second conduction type conduction layer 216 can be formed having a less than a 0.5 μm junction depth.

Then, a first conduction type conduction layer 214 can be formed on the second conduction type conduction layer 216. For example, a low concentration N-type conduction layer 214 can be formed on the second conduction type conduction layer 216 by performing blanket-ion implantation on the entire surface of the second substrate 200 without a mask. In an embodiment, the first conduction type conduction layer 214 can be formed having a 1.0~2.0 μm junction depth.

According to an embodiment, as the first conduction type conduction layer 214 is formed thicker than the second conduction type conduction layer 216, charge storing capacity can be improved. By forming the N-type conduction layer 214 thicker than the high concentration P-type conduction layer 216, the charge storing capacity can be improved because of the enlarged charge storing area due to the thicker N-type conduction layer 214.

In a further embodiment, a high concentration first conduction type conduction layer 212 can be formed on the first conduction type conduction layer 214. For example, a high concentration N+ type conduction layer 212 can be formed on the first conduction type conduction layer 214 by performing blanket-ion implantation on the entire surface of the second substrate 200 without a mask. The high concentration first conduction type conduction layer 212 can contribute to ohmic contact between the photodiode 210 and the interconnection 150 of the first substrate 100.

Figure 5:
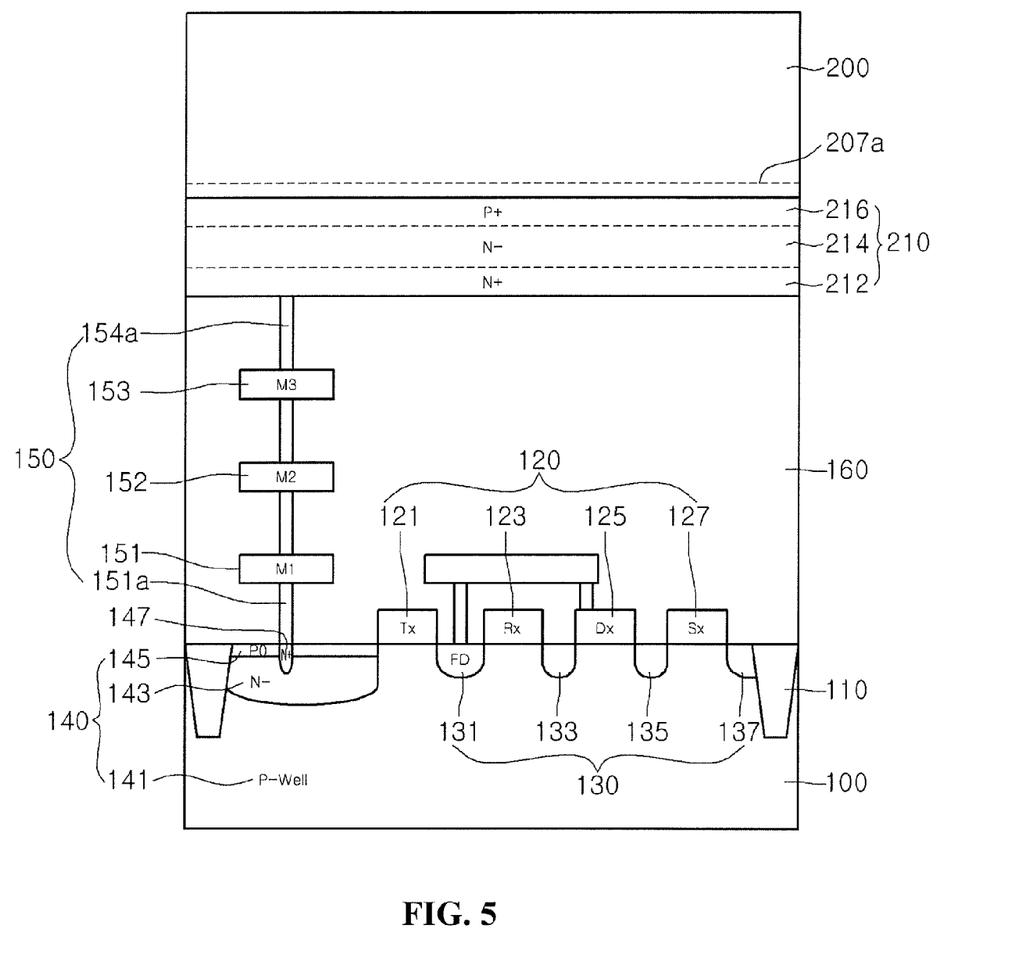

Next, referring to FIG. 5, the first substrate 100 and the second substrate 200 can be bonded such that the photodiode 210 contacts the interconnection 150. At this point, before the first substrate 100 and the second substrate 200 are bonded to each other, the bonding can be performed by increasing the surface energy of a surface to be bonded through activation by plasma. Meanwhile, in certain embodiments, the bonding can be performed with a dielectric or a metal layer disposed on a bonding interface in order to improve bonding force.

Figure 6:
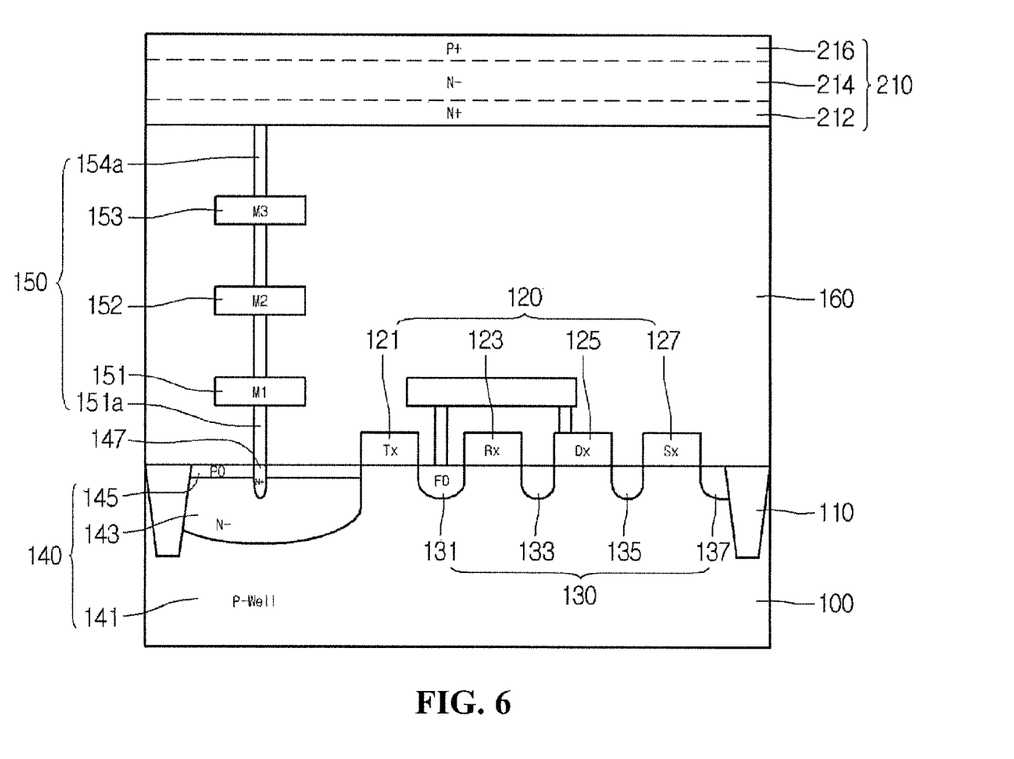

After bonding the first substrate 100 and the second substrate 200 to each other, the hydrogen ion implantation layer 207a can be changed into a hydrogen gas layer (not shown) by performing a heat treatment. After that, a portion of the second substrate 200 can be removed using a blade with the photodiode 210 left under the hydrogen gas layer, so that the photodiode 210 can be exposed as shown in FIG. 6.

Then, an etching separating the photodiode for each unit pixel can be performed. In an embodiment, the etched portion can be filled with an interpixel dielectric (not shown).

Figure 7:
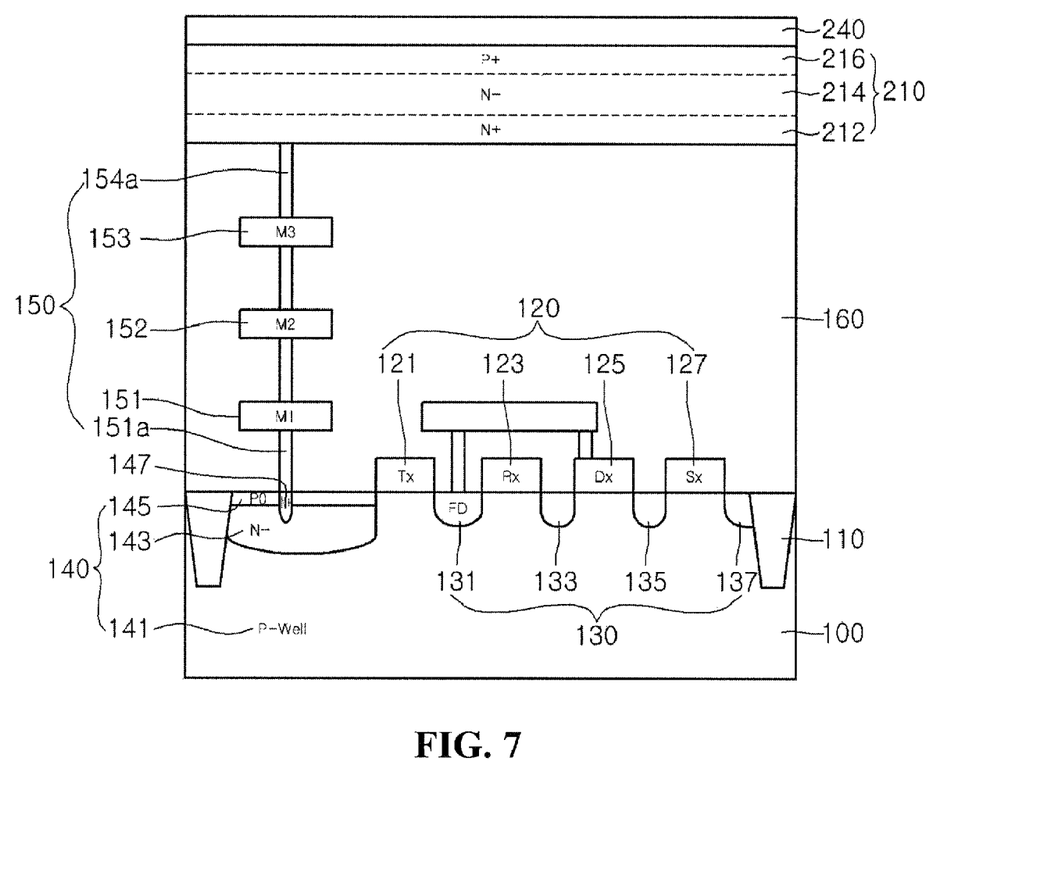

Next, referring to FIG. 7, processes for forming an upper electrode 240 and a color filter (not shown) can be performed.

In the image sensor and the manufacturing method thereof according to an embodiment, a device is designed such that there is a potential difference between the source and drain of the transfer transistor Tx, so that a photo charge can be fully dumped.

Also, according to an embodiment, the charge connection region is formed between the photodiode and the readout circuitry to provide a swift movement path of a photo charge, so that a dark current source is minimized, and saturation reduction and sensitivity reduction can be inhibited.

Figure 8:
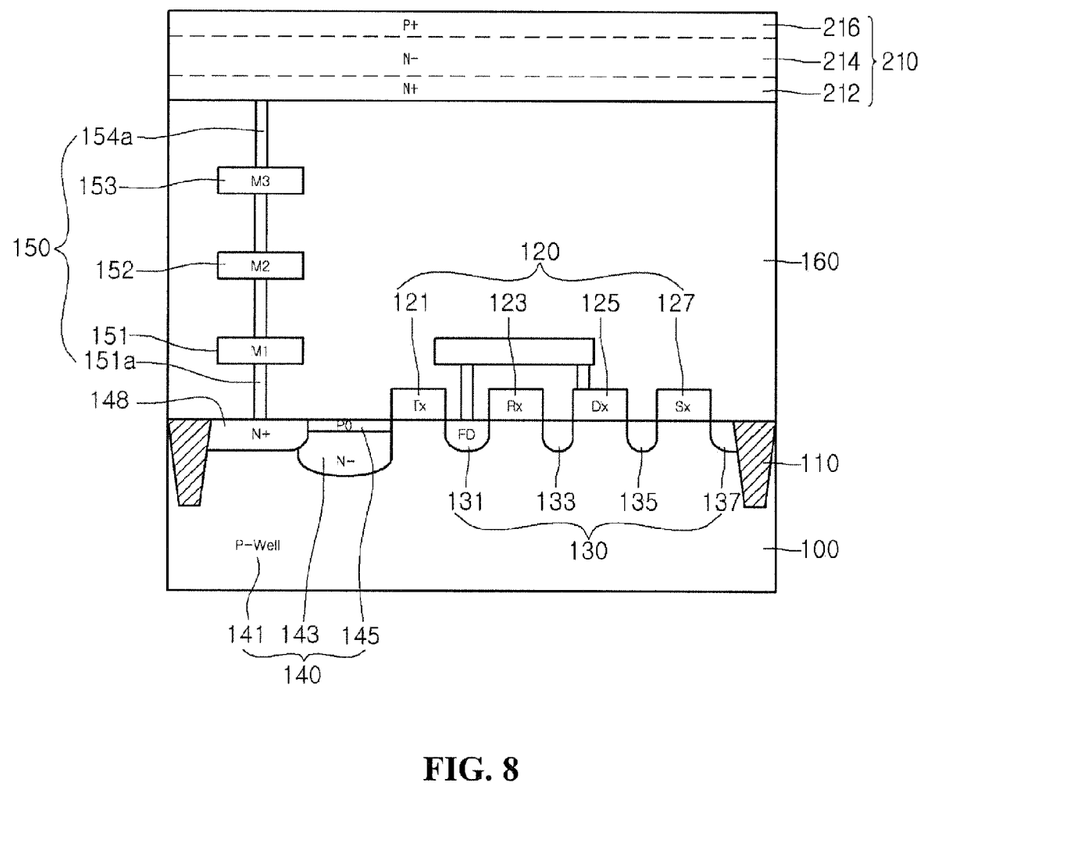
FIG. 8 is a cross-sectional view of an image sensor according to another embodiment.

FIG. 8 is a cross-sectional view of an image sensor according to another embodiment, and illustrates a first substrate including an interconnection 150 in detail.

As shown in FIG. 8, the image sensor can include: a readout circuitry 120 formed on a first substrate 100; an electrical junction region 140 in the first substrate, the electrical junction region 140 being electrically connected with the readout circuitry 120; an interconnection 150 electrically connected with the electrical junction region 140; and an image sensing device 210 on the interconnection 150.

The present embodiment can adopt the technical characteristics of the embodiments described with respect to FIGS. 1-7.

For example, a device can be designed such that there is a potential difference between the source and drain of a transfer transistor Tx, so that a photo charge can be fully dumped.

Also, according to an embodiment, a charge connection region is formed between a photodiode and the readout circuitry to provide a swift movement path of a photo charge, so that a dark current source is minimized, and saturation reduction and sensitivity reduction can be inhibited.

Meanwhile, unlike the embodiment described with respect to FIG. 1, a first conduction type connection region 148 is formed at a side of the electrical junction region 140.

According to an embodiment, an N+ connection region 148 for ohmic contact can be formed adjacent the P0/N−/P− junction 140. At this point, a process of forming the N+ connection region 148 and an M1C contact 151a may provide a leakage source because the device operates with a reverse bias applied to the P0/N−/P− junction 140 and so an electric field EF can be generated on the Si surface. A crystal defect generated during the contact forming process inside the electric field serves as a leakage source.

Also, in the case where the N+ connection region 148 is formed on the surface of the P0/N−/P− junction 140, an electric field due to the N+/P0 junction 148/145 is added. This electric field also serves as a leakage source.

Therefore, a layout is provided in which a first contact plug 151a is formed in an active region not doped with a P0 layer, but instead an N+ connection region 148. Then, through the N+ connection region 148, the first contact plug 151a is connected with the N-junction 143.

According to an embodiment, the electric field is not generated on the Si surface. Thus, a dark current of a 3D integrated CIS can be reduced.

Figure 9:
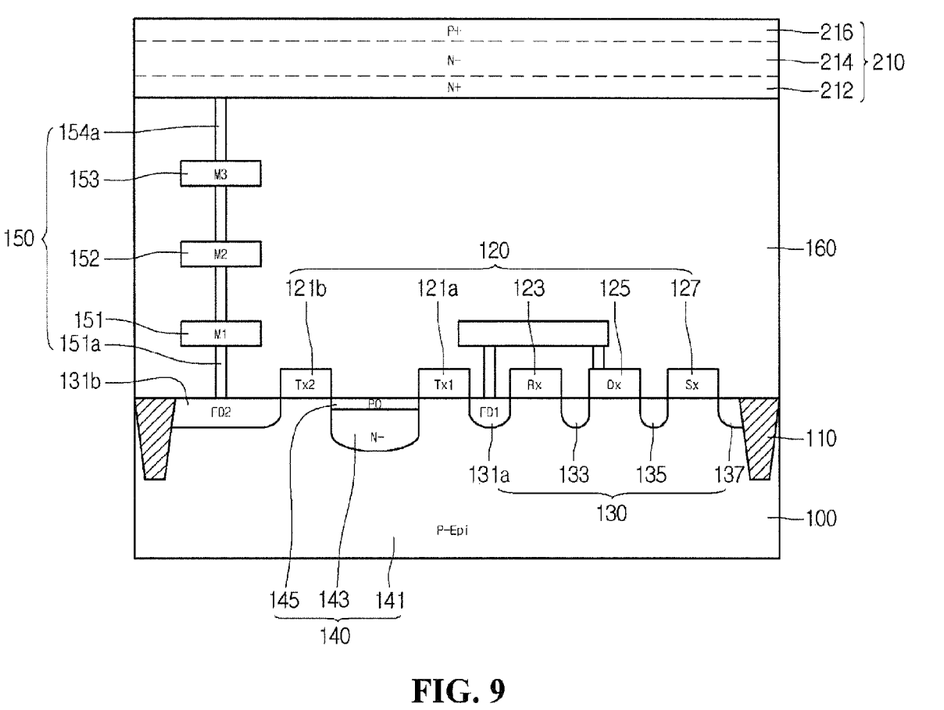
FIG. 9 is a cross-sectional view of an image sensor according to yet another embodiment.

FIG. 9 is a cross-sectional view of an image sensor according to yet another embodiment, and illustrates a first substrate including an interconnection 150 in detail.

As shown in FIG. 9, the image sensor can include: a readout circuitry 120 comprising a first transistor 121a and a second transistor 121b on the first substrate 100; an electrical junction region 140 between the first transistor 121a and the second transistor 121b in the first substrate 100, the electrical junction region 140 being electrically connected with the readout circuitry 120; an interconnection 150 electrically connected to the electrical junction region 140; and an image sensing device 210 on the interconnection 150.

The present embodiment can adopt the technical characteristics of the embodiments described above.

For example, according to an embodiment, a device can be designed such that there is a potential difference between the source and drain of a transfer transistor Tx, so that a photo charge can be fully dumped.

Also, according to an embodiment, a charge connection region is formed between a photodiode and the readout circuitry to provide a swift movement path of a photo charge, so that a dark current source is minimized, and saturation reduction and sensitivity reduction can be inhibited.

Meanwhile, the forming of the readout circuitry 120 on the first substrate 100 is described in more detail according to this embodiment.

A first transistor 121a and a second transistor 121b can be formed on the first substrate 100. For example, the first transistor 121a and the second transistor 121b can be, but are not limited to, a first transfer transistor 121*a* and a second transfer transistor 121*b*, respectively. The first transistor 121*a* and the second transistor 121*b* can be formed simultaneously or sequentially.

After that, the electrical junction region 140 can be formed between the first transistor 121*a* and the second transistor 121*b*. In one embodiment, the electrical junction region 140 can be a PN junction 140.

For example, the PN junction 140 according to an embodiment can include a first conduction type ion implantation layer 143 formed on a second conduction type epitaxial layer (or well) 141, and a second conduction type ion implantation layer 145 formed on the first conduction type ion implantation layer 143.

In a specific embodiment, the PN junction 140 can be the P0(145)/N−(143)/P−(141) junction shown in FIG. 2.

A high concentration first conduction type connection region 131*b* connected with the interconnection 150 can be formed at one side of the second transistor 121*b*. The high concentration first conduction type connection region 131*b* can be a high concentration N+ ion implantation region (N+ junction) and can serve as, but is not limited to, a second floating diffusion region FD 2 (131*b*).

The readout circuitry according to an embodiment includes a portion for moving an electron generated from the photodiode in the upper portion of a chip to the N+ junction 131*b* of the Si substrate in which the readout circuitry is formed, and a portion for moving an electron of the N+ junction 131*b* to an N− junction 143, so that a 4Tr operation can be realized.

A reason for forming the P0/N−/P− junction 140 and the N+ junction 131*b* separately as in FIG. 9 is given as follows.

When N+ doping and a contact are formed in the PNP junction 140 of the P0/N−/P− junction 140, a dark current can be generated by the N+ layer on the PNP junction 140 and a contact etch damage. To reduce this dark current, the N+ junction 131*b*, which is a contact formation portion, can be separated from the PNP junction 140.

That is, when the N+ doping and contact etch are performed on the surface of the PNP junction 140, leakage sources may be formed. To inhibit formation of these leakage sources, a contact can be formed on the N+/P− epitaxial junction 131*b*.

Since a gate of the second transistor Tx 2 (121*b*) and a gate of the first transistor Tx1 (121*a*) are turned on during a signal readout operation, an electron generated from the photodiode 210 at the upper portion of the chip passes from the first conduction type connection region 131*b* through the P0/N−/P− epitaxial junction 140 and moves to a first floating diffusion region FD 1 (131*a*), so that correlated double sampling can be realized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry comprising a first transistor and a second transistor on a first substrate, wherein the first transistor comprises a first transfer transistor and the second transistor comprises a second transfer transistor;
   an electrical junction region between the first transfer transistor and the second transfer transistor in the first substrate, the electrical junction region being electrically connected with the readout circuitry;
   an interconnection for connection to the electrical junction region; and
   an image sensing device on the interconnection,
   wherein each pixel comprises the first transfer transistor and the second transfer transistor.

2. The image sensor according to claim 1, further comprising a first conduction type second connection region at one side of the second transfer transistor, the first conduction type second connection region being connected with the interconnection, wherein a signal from the interconnection passes from the first conduction type second connection region to the electrical junction region when the second transfer transistor is turned on.

3. The image sensor according to claim 1, wherein the electrical junction region comprises:
   a first conduction type ion implantation region in the first substrate; and
   a second conduction type ion implantation region on the first conduction type ion implantation region.

4. The image sensor according to claim 1, wherein the electrical junction region provides a potential difference between a source and a drain of the first transfer transistor of the readout circuitry.

5. The image sensor according to claim 4, wherein an ion implantation concentration of the electrical junction region at the source of the first transfer transistor is lower than an ion implantation concentration of a floating diffusion region at the drain of the first transfer transistor.

6. The image sensor according to claim 1, wherein the electrical junction region comprises a PN junction.

7. The image sensor according to claim 1, wherein the electrical junction region comprises a PNP junction.

8. The image sensor according to claim 1, further comprising a first conduction type connection region between the electrical junction region and the interconnection.

9. The image sensor according to claim 8, wherein the first conduction type connection region is formed at a side of the second transfer transistor.

10. The image sensor according to claim 1, wherein the image sensing device comprises:
    a first conduction type conduction layer; and
    a second conduction type conduction layer on the first conduction type conduction layer.

11. A method for manufacturing an image sensor, comprising:
    forming a readout circuitry comprising a first transistor and a second transistor on a first substrate, wherein the first transistor comprises a first transfer transistor and the second transistor comprises a second transfer transistor;

forming an electrical junction region between the first transfer transistor and the second transfer transistor in the first substrate, the electrical junction region being electrically connected with the readout circuitry;

forming an interconnection for connection to the electrical junction region; and forming an image sensing device on the interconnection, wherein each pixel comprises the first transfer transistor and the second transfer transistor.

12. The method to claim 11, further comprising forming a first conduction type second connection region at one side of the second transfer transistor, the first conduction type second connection region being connected with the interconnection, wherein a signal from the interconnection passes from the first conduction type second connection region to the electrical junction region when the second transfer transistor is turned on.

13. The method to claim 11, wherein forming the electrical junction region comprises:

forming a first conduction type ion implantation region in the first substrate; and forming a second conduction type ion implantation region on the first conduction type ion implantation region.

14. The method according to claim 11, wherein the electrical junction region is formed such that there is a potential difference between a source and a drain of the first transfer transistor of the readout circuitry.

15. The method according to claim 14, wherein an ion implantation concentration of the electrical junction region at the source of the first transfer transistor is lower than an ion implantation concentration of a floating diffusion region at the drain of the first transfer transistor.

16. The method according to claim 11, wherein the electrical junction region comprises a PN junction.

17. The method according to claim 11, further comprising forming a first conduction type connection region between the electrical junction region and the interconnection.

18. The method according to claim 17, wherein the first conduction type connection region is formed at a side of the second transfer transistor.

19. The method according to claim 11, wherein forming the image sensing device comprises:

forming a first conduction type conduction layer; and forming a second conduction type conduction layer on the first conduction type conduction layer.

20. The method according to claim 11, wherein forming the image sensing device comprises bonding a second substrate comprising the image sensing device to the first substrate.

* * * * *